United States Patent
Kang et al.

(10) Patent No.: US 10,784,253 B2
(45) Date of Patent: Sep. 22, 2020

(54) LOW VOLTAGE TRENCH METAL OXIDE SEMICONDUCTOR FIELD EFFECT TRANSISTOR

(71) Applicant: Magnachip Semiconductor, Ltd., Cheongju-si (KR)

(72) Inventors: Soo Chang Kang, Seoul (KR); Seung Hyun Kim, Seoul (KR); Yong Won Lee, Bucheon-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 82 days.

(21) Appl. No.: 15/373,906

(22) Filed: Dec. 9, 2016

(65) Prior Publication Data
US 2017/0194316 A1    Jul. 6, 2017

(30) Foreign Application Priority Data
Dec. 31, 2015 (KR) .................. 10-2015-0191194

(51) Int. Cl.
| | |
|---|---|
| *H01L 27/02* | (2006.01) |
| *H01L 49/02* | (2006.01) |
| *H01L 29/06* | (2006.01) |
| *H01L 29/417* | (2006.01) |
| *H01L 29/423* | (2006.01) |
| *H01L 29/78* | (2006.01) |
| *H01L 29/861* | (2006.01) |

(52) U.S. Cl.
CPC ...... *H01L 27/0288* (2013.01); *H01L 27/0255* (2013.01); *H01L 28/20* (2013.01); *H01L 29/0696* (2013.01); *H01L 29/41741* (2013.01); *H01L 29/4236* (2013.01); *H01L 29/7803* (2013.01); *H01L 29/7813* (2013.01); *H01L 29/7827* (2013.01); *H01L 29/4238* (2013.01); *H01L 29/861* (2013.01)

(58) Field of Classification Search
CPC ............. H01L 29/7813; H01L 27/0255; H01L 29/7808; H01L 29/66734; H01L 29/7804; H01L 29/0619; H01L 29/866; H01L 29/861; H01L 27/0288; H01L 27/0248; H01L 29/4236; H01L 29/66136; H01L 29/7397; H01L 29/66143; H01L 29/868; H01L 29/0646; H01L 2924/12036; H01L 2924/12031; H01L 29/8613

See application file for complete search history.

(56) References Cited

U.S. PATENT DOCUMENTS

| | | | | |
|---|---|---|---|---|
| 5,502,338 | A * | 3/1996 | Suda ................. | H01L 27/0825 123/651 |
| 8,735,968 | B2 * | 5/2014 | Li ...................... | H01L 27/0629 257/328 |
| 8,872,245 | B2 * | 10/2014 | Shimatou ........... | H01L 29/0619 257/288 |
| 8,981,471 | B2 * | 3/2015 | Yagi ................. | H01L 21/823475 257/331 |

(Continued)

*Primary Examiner* — Khiem D Nguyen
(74) *Attorney, Agent, or Firm* — Adam P. Daniels, Esq.; Polsinelli PC

(57) ABSTRACT

A semiconductor device includes a substrate and a source metal formed on the substrate. A gate pad is formed on the substrate adjacent to the source metal. A gate metal is formed on the substrate and surrounds the gate pad and the source metal. A first diode is formed between the gate metal and the source metal.

18 Claims, 10 Drawing Sheets

(56) References Cited

U.S. PATENT DOCUMENTS

| | | | |
|---|---|---|---|
| 2002/0088991 A1* | 7/2002 | Hisamoto | H01L 27/0629 257/172 |
| 2003/0057497 A1* | 3/2003 | Higashida | H01L 27/0255 257/356 |
| 2007/0262390 A1* | 11/2007 | Ishida | H01L 29/7811 257/368 |
| 2008/0290367 A1* | 11/2008 | Su | H01L 27/0255 257/173 |
| 2009/0166740 A1* | 7/2009 | Bhalla | H01L 27/0255 257/355 |
| 2010/0148268 A1* | 6/2010 | Noguchi | H01L 29/7804 257/367 |
| 2010/0200920 A1* | 8/2010 | Su | H01L 27/0255 257/355 |
| 2010/0321092 A1* | 12/2010 | Momota | H01L 29/0696 327/512 |
| 2011/0291186 A1* | 12/2011 | Yilmaz | H01L 29/66719 257/334 |
| 2012/0205745 A1* | 8/2012 | Havanur | H03K 17/08142 257/355 |
| 2012/0326207 A1* | 12/2012 | Yoshimochi | H01L 29/866 257/139 |
| 2013/0075809 A1* | 3/2013 | Hsieh | H01L 29/66106 257/328 |
| 2013/0092976 A1* | 4/2013 | Hsieh | H01L 27/0629 257/133 |
| 2015/0380484 A1* | 12/2015 | Yoshimochi | H01L 29/866 257/334 |

* cited by examiner

LOW VOLTAGE TRENCH METAL OXIDE SEMICONDUCTOR FIELD EFFECT TRANSISTOR

CROSS REFERENCE TO PRIOR APPLICATIONS

This application claims priority to and the benefit of Korean Patent Application No. 10-2015-0191194 filed on Dec. 31, 2015, titled LOW VOLTAGE TRENCH METAL OXIDE SEMICONDUCTOR FIELD EFFECT TRANSISTOR, the entirety of which is hereby incorporated herein by reference.

FIELD OF THE DISCLOSURE

The present disclosure generally relates to a semiconductor device, and particular to a semiconductor device exhibiting improved electrostatic discharge (ESD) resistance and a low on-state resistance ($R_{ON}$).

BACKGROUND OF THE DISCLOSURE

Electrostatic discharge (ESD) is a sudden flow of electricity between two electrically charged objects caused by contact, an electrical short, or dielectric breakdown. In some instances, ESD can create instantaneously very high voltage and current, which, if allowed to flow into a semiconductor device, may put the device in danger of a fatal breakdown. Therefore, semiconductor devices are frequently designed and manufactured to include certain ESD protection features to divert or redirect a high voltage caused by ESD to a safe path when ESD is externally introduced thereto. However, due to the limited space issues in designing and manufacturing semiconductor integrated circuit (IC) devices, it is challenging to allocate sufficient space for effective ESD protection circuitry.

Accordingly, there exists a need for implementing sufficient and effective ESD protection in semiconductor devices without increasing the device sizes.

SUMMARY OF THE DISCLOSURE

One aspect of the present disclosure provides a semiconductor device, which includes a substrate and a source metal formed on the substrate. A gate pad is formed on the substrate adjacent to the source metal. A gate metal is formed on the substrate and surrounds the gate pad and the source metal. A diode is formed between the gate metal and the source metal.

The diode may be further formed between the source metal and the gate pad.

The diode may include a first electrode connected to the source metal and a second electrode connected to the gate metal. The diode may further include a pair of first regions doped with a first conductivity type impurity, and a second region doped with a second conductivity type impurity and sandwiched between the pair of first regions.

The gate metal may be connected to the gate pad.

The semiconductor device may further include a trench formed in the substrate, and a gate electrode formed in the trench. The semiconductor device may further include a protection film formed on side and bottom surfaces of the substrate surrounding the trench, wherein the gate electrode may be formed on the protection film in the trench.

The trench may include at least one of a first trench extending between a portion of the substrate underlying the source metal and a portion of the substrate underlying the gate pad, and a second trench extending between a portion of the substrate underlying the source metal and a portion of the substrate underlying the gate metal.

The trench may include a cell trench formed in a portion of the substrate underlying the source metal, and an extended trench formed in the substrate and extending from the portion of the substrate underlying the source metal to a portion of the substrate underlying the gate pad or the gate metal. The gate electrode may include a cell gate electrode formed in the cell trench; and an extended gate electrode formed in the extended trench.

The semiconductor device may further include a gate resistor connected between the gate pad and the gate metal.

The semiconductor device may include a trench metal oxide silicon field effect transistor (MOSFET).

According to another aspect of the disclosure, a semiconductor device includes a substrate and a first source metal formed on the substrate. A gate pad is formed on the substrate adjacent to the source metal with a first gap therebetween. A gate metal is formed on the substrate and at least partially surrounds the first source metal. A second source metal is formed on the substrate and surrounds the gate metal with a second gap therebetween. A diode is formed on the substrate in the second gap between the second source metal and the gate metal.

The gate metal may be connected to the gate pad.

The semiconductor device may further include a gate resistor coupled between the gate pad and the gate metal.

The diode may include a first electrode connected to the second source metal and a second electrode connected to the gate metal. The diode may further include a pair of first regions doped with a first conductivity type impurity, and a second region doped with a second conductivity type impurity and sandwiched between the pair of first regions.

The semiconductor device may further include a trench formed in the substrate, and a gate electrode formed in the trench. The semiconductor device may further include a protective film formed on side and bottom surfaces of the substrate surrounding the trench, wherein the gate electrode may be formed on the protective film.

The second source metal may be connected to the first source metal.

According to yet another aspect of the disclosure, a semiconductor device includes a substrate. A source metal and a gate pad are formed on the substrate and spaced apart from each other. A gate metal is formed on the substrate surrounding the source metal and the gate pad, wherein the gate metal is spaced apart from the source metal with a predetermined gap therebetween. A diode is formed in the predetermined gap between the source metal and the gate metal.

Additional features, advantages, and embodiments of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1A:
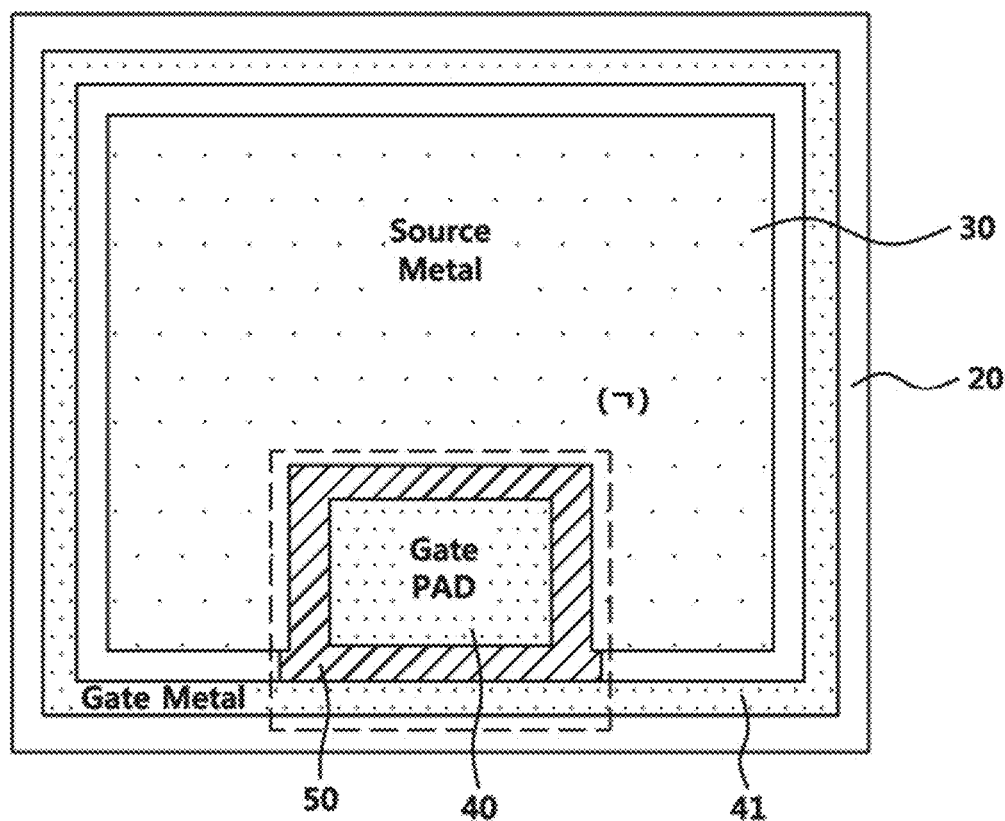
FIG. 1A illustrates an example of a semiconductor device.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

Figure 1B:
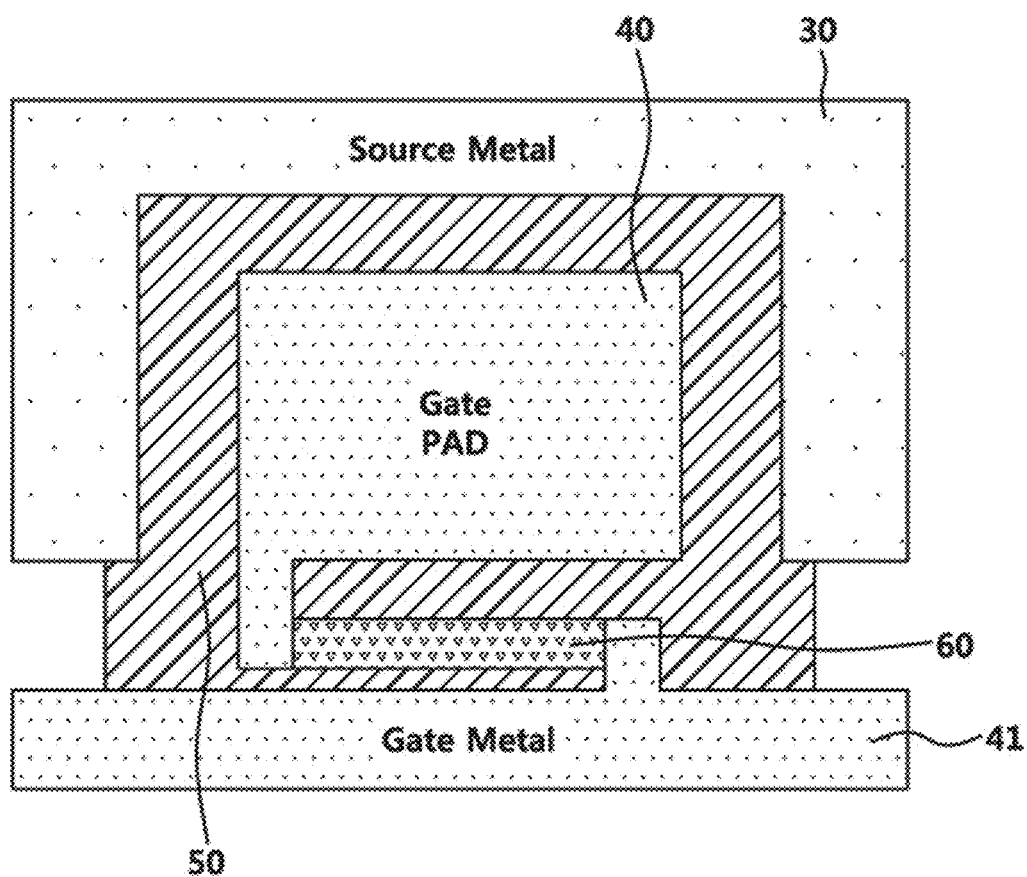
FIG. 1B illustrates a partial enlarged view of the semiconductor device shown in FIG. 1A.
Figure 1C:
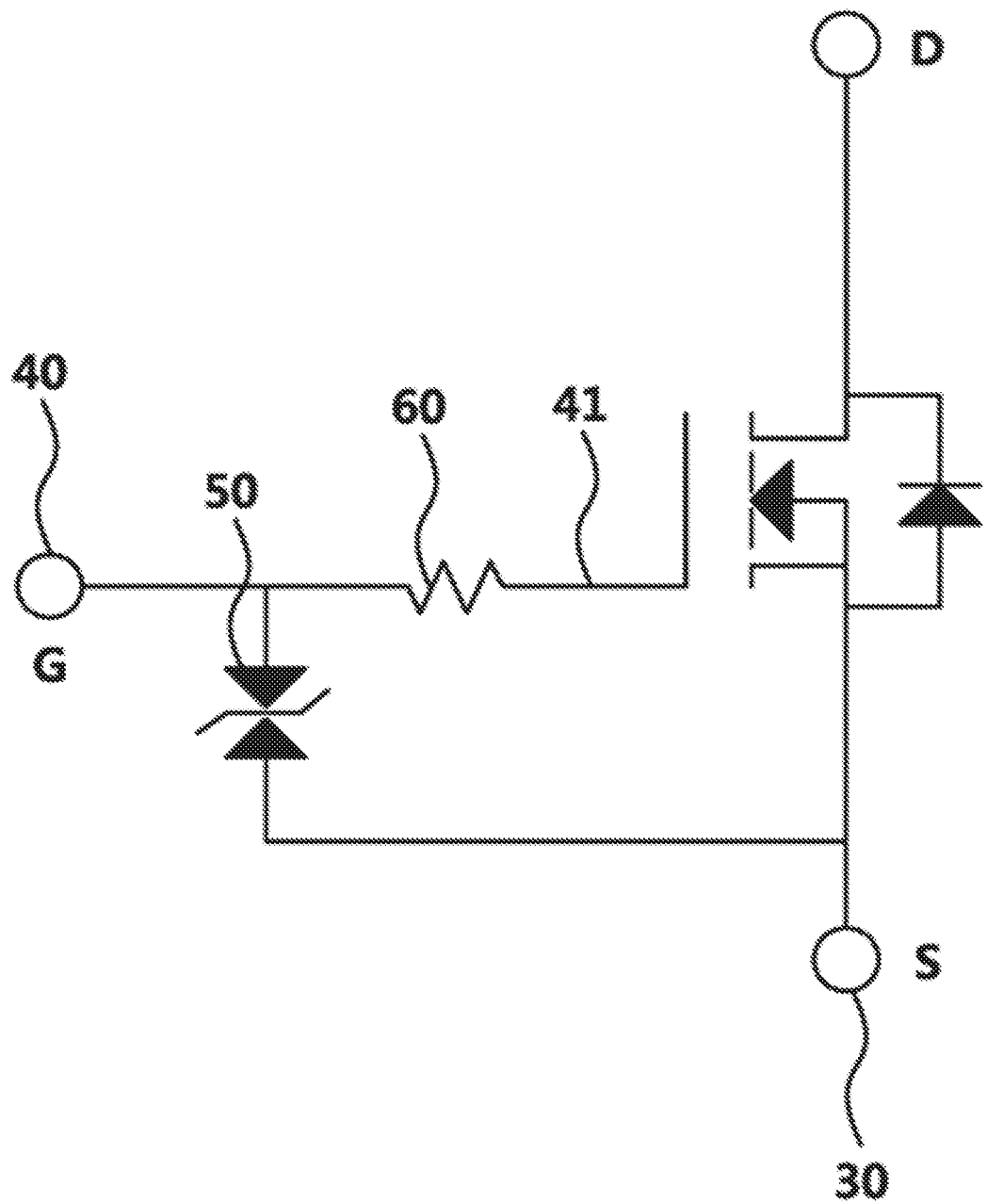
FIG. 1C illustrates an equivalent circuit of the semiconductor device shown in FIGS. 1A and 1B.

FIG. 1A illustrates a semiconductor device 10, constructed according to state of art principles. FIG. 1B illustrates a partial enlarged view of a portion (⌐) of the semiconductor device 10 shown in FIG. 1A as a rectangular box in broken lines. FIG. 1C illustrates an equivalent circuit of the semiconductor device 10 shown in FIGS. 1A and 1B. The semiconductor device 10 may be a metal oxide semiconductor field effect transistor (MOSFET), and, in particular, a trench MOSFET.

Referring to FIGS. 1A and 1B concurrently, the semiconductor device 10 may include, for example, a substrate 20, a source metal 30, a gate pad 40, a gate metal 41, a diode 50, a resistor 60, and/or the like. The source metal 30 and the gate pad 40 may be formed on the substrate 20. The gate pad 40 may be formed adjacent to the source metal 30, and the gate metal 41 may be formed around the source metal 30 and the gate pad 40. Referring to FIG. 1B, the resistor 60 may be coupled between the gate pad 40 and the gate metal 41. The diode 50 may be formed around the gate pad 40. The gate pad 40 may be connected to a lead of the package (not shown) of the semiconductor device 10, for example, through wire bonding, or the like, of which the horizontal and vertical lengths may be predetermined according to design rules.

Referring to FIG. 1B, a metal gap may be formed between the gate pad 40 and the source metal 30 and between the gate pad 40 and the gate metal 41. The diode 50 may be formed in the metal gap that surrounds the gate pad 40.

Referring to FIG. 1C, the gate pad 40 may instantaneously receive high voltage and current when an ESD is externally applied thereto. The ESD voltage may be clamped by the diode 50 to be less than the peak-inverse-voltage (PIV) of the diode 50, and the ESD current may be discharged via a ground (not shown) connected to the source metal 30. In doing so, the resistor 60 connected between the gate pad 40 and the gate metal 41 may delay the ESD flow to prevent the ESD voltage and current from being applied directly to the gate metal 41.

To improve ESD resistance, it is desirable to increase the size of the ESD protection device, which may also require allocating a larger space for the diode 50. However, the diode 50 is formed in the metal gap between the gate pad 40 and the source metal 30, and therefore any attempts to increase the size of the diode 50 may result in needing to reduce the sizes of the gate pad 40 and/or the source metal 30. When the gate pad 40 is already reduced to the minimum size limit specified by design rules, the size of the source metal 30 may need to be reduced. Also, referring to FIG. 1B, the MOSFET 10 requires the resistor 60 to be formed and connected between the gate pad 40 and the gate metal 41. Therefore, any attempts to enlarge the diode 50 may result in increasing the size of the MOSFET 10, which may also increase the on-state resistance ($R_{ON}$) by the resistor 60.

Figure 2A:
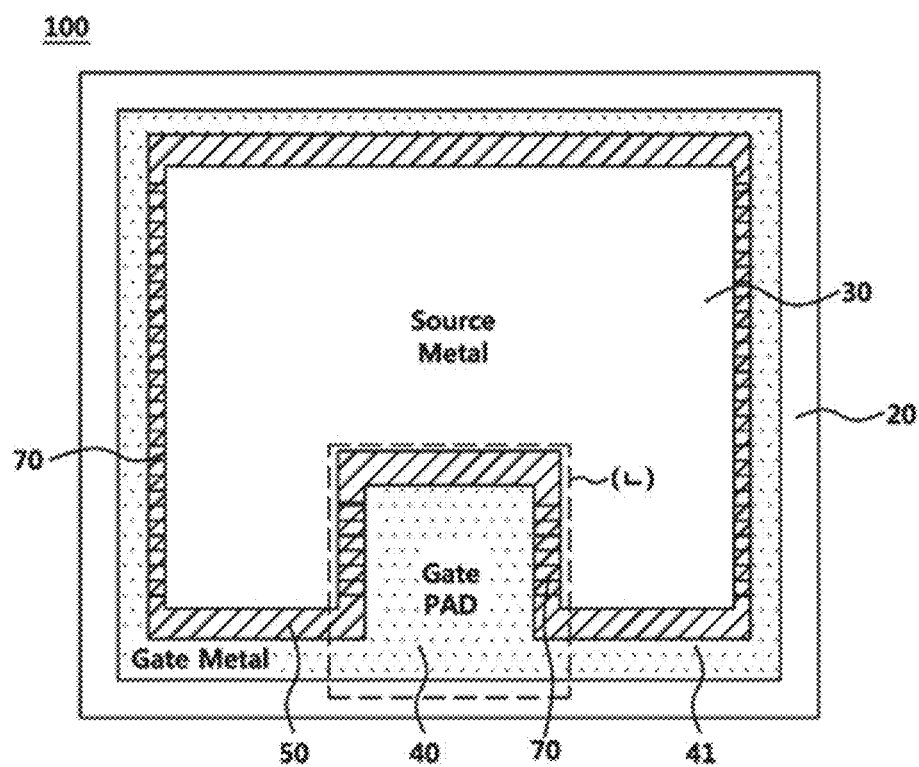
FIG. 2A illustrates an example of a low voltage trench MOSFET semiconductor device, constructed according to the principles of the disclosure.
Figure 2B:
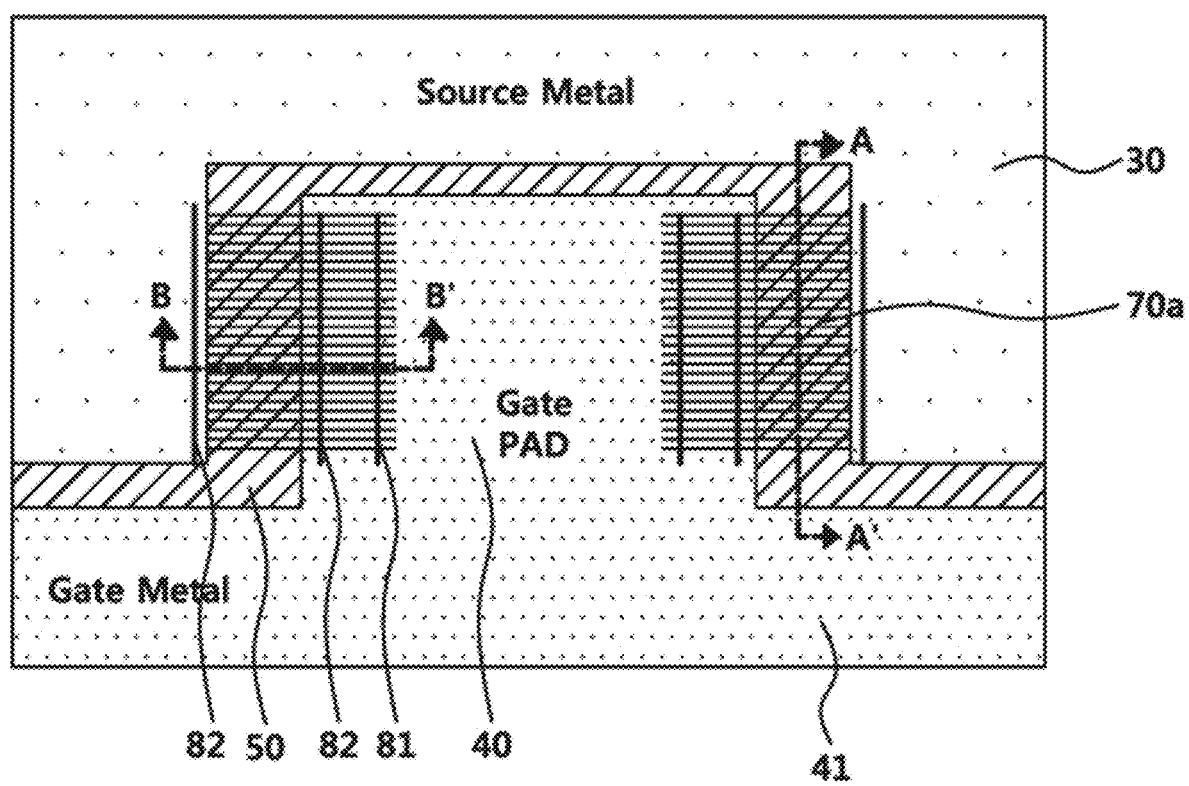
FIG. 2B illustrates a partial enlarged view of the semiconductor device shown in FIG. 2A.
Figure 2C:
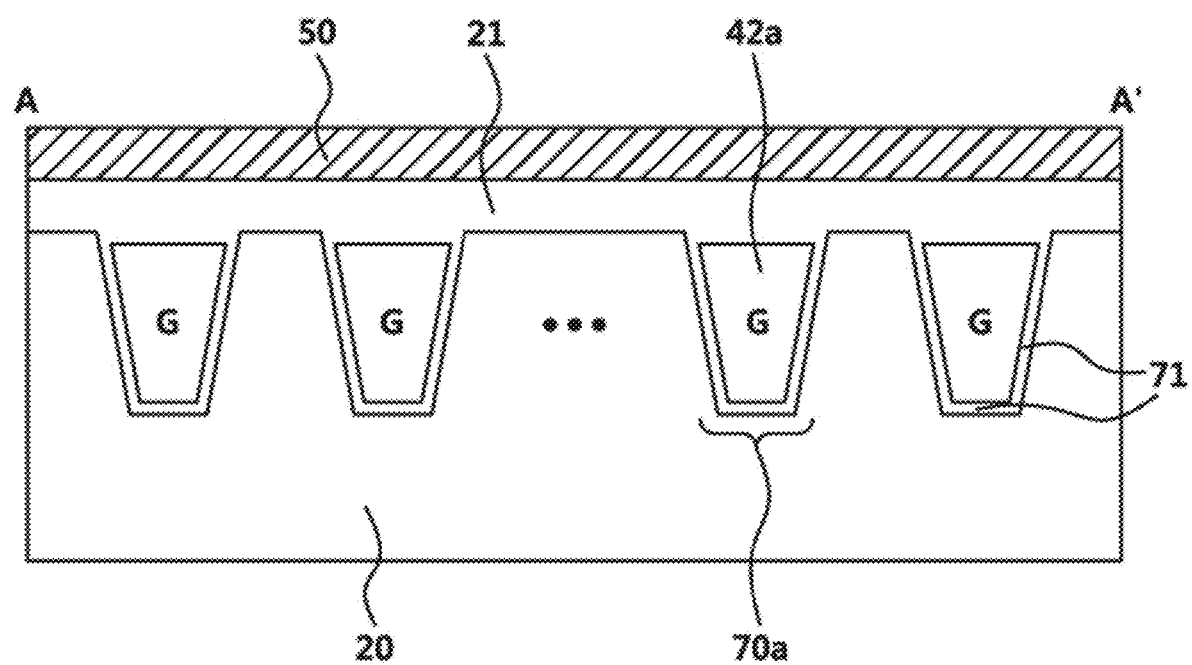
FIG. 2C illustrates a cross section view of the semiconductor device shown in FIGS. 2A and 2B, cut along the line A-A' in FIG. 2B.
Figure 2D:
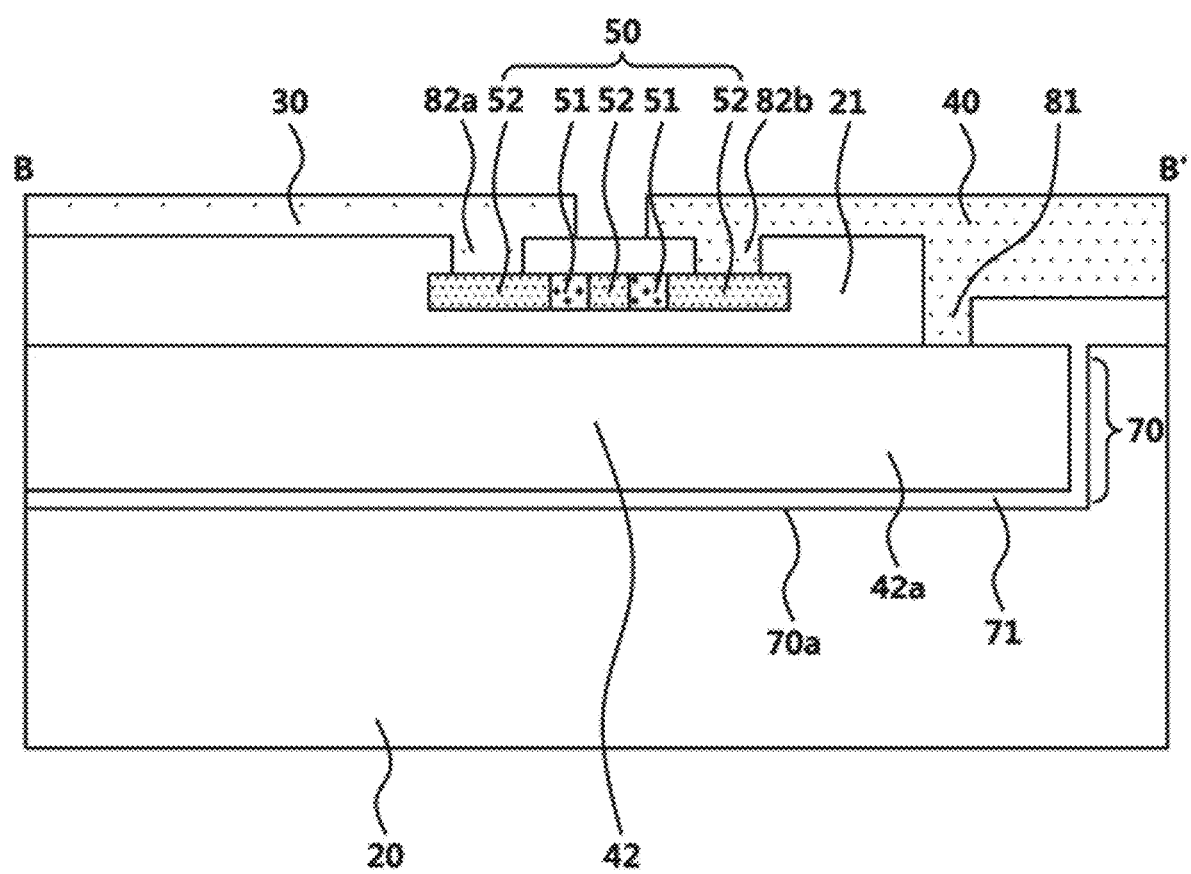
FIG. 2D illustrates another cross section view of the semiconductor device shown in FIGS. 2A and 2B, cut along the line B-B' in FIG. 2B.

FIGS. 2A, 2B, 2C and 2D illustrate an example of a semiconductor device 100 (e.g., trench MOSFET), constructed according to the principles of the disclosure. Referring to FIG. 2A, the semiconductor device 100 may include, for example, a substrate 20, a source metal 30, a gate pad 40, a gate metal 41, a gate electrode 42 (shown in FIG. 2D), a diode 50, a trench 70, and/or the like. The source metal 30 and the gate pad 40 may be formed on or in the substrate 20. The gate pad 40 may be formed adjacent to the source metal 30. The gate metal 41 may formed on or in the substrate 20 and may surround the gate pad 40 and the source metal 30. The diode 50 may be formed between the gate metal 41 and the source metal 30. As seen in FIG. 2D, the gate electrode 42 may be formed within the trench 70.

Referring to FIG. 2A, the diode 50 may be formed between the source metal 30 and the gate metal 41. The source metal 30 may have a longer circumference (or larger perimeter) than the gate pad 40, and the diode 50 may be formed around the source metal 30. Hence, a total length of the diode 50 may be greatly increased, which may result in an increased area for the diode 50. In doing so, the diode 50 is formed at or in the metal gap between the source metal 30 and the gate metal 41, and the metal gap between the source metal 30 and the gate pad 40 may be set independently of the diode 50.

The ESD resistance or ability of the semiconductor device 100 to withstand ESD may increase as the area of the diode 50 increases. As seen in FIG. 2A, the diode 50 may be formed in the metal gap between the source metal 30 and the gate metal 41. Such arrangement may increase the area of the diode 50 and, hence, the ability of the diode 50 to withstand ESD may also be increased. With the increased ESD resistance, the diode 50 may be able to clamp a high ESD voltage applied to the gate pad 40 in a stable manner, and may effectively prevent the ESD voltage and current from flowing from the gate pad 40 to gate metal 41.

As seen in FIG. 2A, the gate metal 41 may be connected to or integrally formed with gate pad 40 without a resistor (e.g., resistor 60 shown in FIG. 1B) coupled therebetween. Because there is no resistor, the on-state resistance ($R_{ON}$) of the semiconductor device 100 may be reduced. Also, since the area occupied by the resistor 60 (shown in FIG. 1B) may be no longer necessary, the size of the semiconductor device 100 (compared to e.g., device 10 shown in FIGS. 1A and 1B) may be reduced.

As seen in FIG. 2D, the gate electrode 42 may be formed in the trench 70, and the trench 70 may be formed in portions of the substrate 20 underlying the source metal 30, the gate pad 40, and the gate metal 41. A transistor cell may be formed by forming a source region (not shown) between the trenches 70, which may be formed at the bottom portion of the source metal 30. The trench 70 is formed in the substrate 20 and extends from a portion of the substrate 20 underlying the source metal 30 to portions of the substrate 20 underlying the gate pad 40 and the gate metal 41. The gate electrode 42 formed in the trench 70 may be electrically connected to the gate pad 40 and the gate metal 41.

In the description below, a cell trench (not shown) formed at a transistor cell region, a cell gate electrode (not shown), an extended trench 70*a* formed at an region extending to the gate pad 40 and the gate metal 41 from the source metal 30, and an extended gate electrode 42*a* are described as separate elements.

Referring to FIG. 2C, the semiconductor device 100 may prevent the ESD voltage and current from flowing to the input terminal by the extended gate electrode 42*a*. That is, the extended gate electrode 42*a* may function as a resistor between the gate pad 40 and the cell gate electrode, and hence may delay the ESD voltage and current flowing in from the low voltage input terminal to the transistor cell region. While the in-flowing voltage and/or current are delayed, the ESD voltage and current may be discharged to the ground via the diode 50, and damage due to the ESD voltage and current may be prevented. In FIG. 2A, the gate pad 40 and the gate electrode 41 are directly connected to or integrally formed with each other, but any in-flowing ESD voltage and/or current may be further prevented by connecting a resistor (e.g., resistor 60 shown in FIG. 1B) between the gate pad 40 and the gate metal 41.

An extended trench 70*a* is shown in FIGS. 2B and 2C. FIG. 2B illustrates an enlarged view of a region (⌐) shown in FIG. 2A. The extended trench 70*a* may be formed in portions of the substrate 20 extending to a portion of the substrate 20 underlying the gate pad 40 from a portion of the substrate 20 underlying the source metal 30. A plurality of trenches 70*a* may be formed spaced apart from each other at a predetermined gap therebetween.

Referring to FIGS. 2C and 2D, at a region where the extended trench 70*a* and the gate pad 40 are overlapped, an extended gate electrode 42*a* formed in the extended trench 70*a*, and a gate electrode contact 81, which electrically connects the gate pad 40, may be formed. The diode 50 may be formed at or in the metal gap between the source metal 30 and gate pad 40. At a region where the diode 50 and the source metal 30 are overlapped, a diode contact 82, which may electrically connect to one side electrode of the diode 50 and the source metal 30, may be formed. At a region where the diode 50 and the gate pad 40 are overlapped, a diode contact 82, which may electrically connect the other electrode of the diode 50 to the gate pad 40, may be formed.

FIG. 2C is a cross sectional view of the semiconductor device 100 shown in FIG. 2B, cut along the broken line A-A'. The semiconductor device 100 may include the substrate 20, the plurality of extended trenches 70*a* formed in an upper surface portion of the substrate 20 at a constant depth, a protection film 71 formed on side and bottom walls of the trench 70, the extended gate electrode 42*a* formed in the trench 70, an insulation film 21 formed on the substrate 20, the diode 50 formed on the insulation film 21, and/or the like.

The trench 70 shown in FIG. 2C is a cross sectional view of the extended trench 70*a*, in which a source region (not shown) is not to be formed, but the cell trench (not shown) formed in a portion of the substrate 20 underlying the source metal 30 may include a source region (not shown) that may be formed by implanting impurity on or in portions of the substrate 20 between the cell trenches.

The extended gate electrode 42*a*, which may be electrically connected to the gate pad 40, may be formed extending along the extended trench 70*a* in a direction from the gate pad 40 to the source metal 30. The extended gate electrode 42*a* may be connected to the cell gate electrode (not shown) formed at the bottom portion of the source metal 30, and may control a channel of the semiconductor device 100.

FIG. 2D is a cross sectional view of the semiconductor device 100 shown in FIG. 2B, cut along the broken line B-B'. The semiconductor device 100 may include the substrate 20, the extended trench 70*a* formed in the upper surface portion of the substrate 20 with a constant depth, the protection film 71 formed on side and bottom walls of the extended trench 70*a*, the extended gate electrode 42*a* formed in the extended trench 70*a*, the insulation film 21 formed on the substrate 20, the diode 50 formed on the insulation film 21, the source metal 30 formed on a portion of the diode 50, the gate pad 40 formed on the other portion of the diode 50 along with the source metal 30 with a predetermined gap therebetween, the gate electrode contact 81 which electrically connects the gate pad 40 and the extended gate electrode 42*a*, the diode contact 82*a* which electrically connects to source metal 30 and the portion of the diode 50, the diode contact 82*b* which electrically connects to the gate pad 40 and the other portion of the diode 50, and/or the like. The cell trench and the extended trench, and the cell gate electrode and the extended gate electrode shown in FIG. 2D have been described as separate elements based on their respective positions, but may be formed simultaneously via the same process.

The diode 50 may include the first doping region 51, which may be formed at one end thereof by, for example, doping the first conductive impurity, and the second doping region 52, which may be connected to the first doping region 51 and formed by, for example, doping the second conductive impurity, of which both may be positioned alternatively on the insulation film 21. As shown in FIG. 2D, in the case that the two first doping regions 51 are formed at the opposite ends of the diode 50 with the second doping region 52 sandwiched therebetween, the diode 50 may form a P-N-P structure and operate as a transient voltage suppression diode. Alternatively, the diode 50 may be constructed in a different manner, to form a constant voltage diode, such as, for example, Zener diode, or the like.

Figure 3:
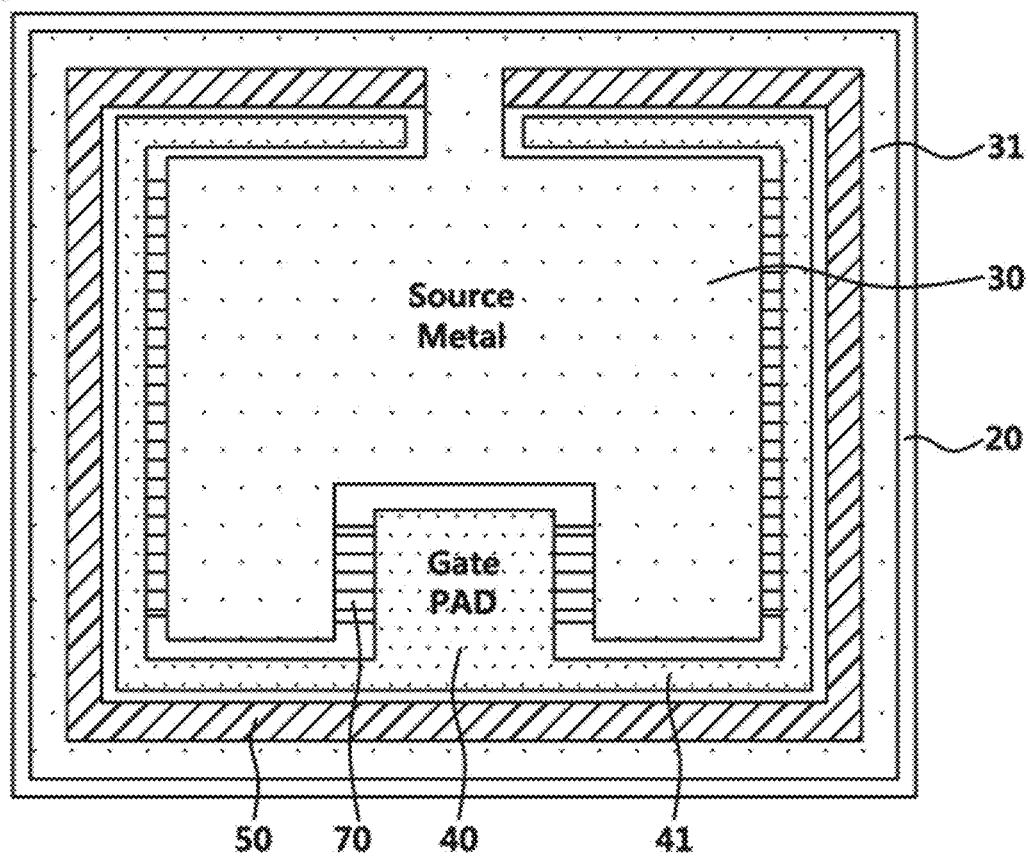
FIG. 3 illustrates another example of a low voltage MOSFET semiconductor device, constructed according to the principles of the disclosure.

FIG. 3 illustrates another example of the semiconductor device 100, constructed according to the principles of the disclosure. As illustrated in FIG. 3, the semiconductor device 100 may include, for example, a substrate 20, a source metal 30, an external source metal 31, a gate pad 40, a gate metal 41, a diode 50, a trench 70 and/or the like. The source metal 30 may be formed on or in the substrate 20. The gate pad 40 may be formed on or in the substrate 20 adjacent to the source metal 30. The gate metal 41 may be formed on or in the substrate 20 and surrounding the source metal 30. The external source metal 31 may be formed on or in the substrate 20, surrounding the gate metal 41 and connected to a side of the source metal 30. The diode 50 may be formed between the gate metal 41 and the external source metal 31 and extending along the gate metal 41. The trench 70 may be formed extending to the source metal 30 from the gate pad 40 and between the gate metal 41 and the source metal 30.

The semiconductor device 100 may include the external source metal 31 formed externally around the gate metal 41 with a predetermined interval therebetween, which may provide more space for the diode 50. By providing more space, the diode 50 and the trench 70 may be formed without overlapping each other on the substrate 20. Also, since it is not necessary to separate the diode 50 and the gate electrode 42 formed on the trench 70, a number of masking steps may be reduced.

Figure 4A:
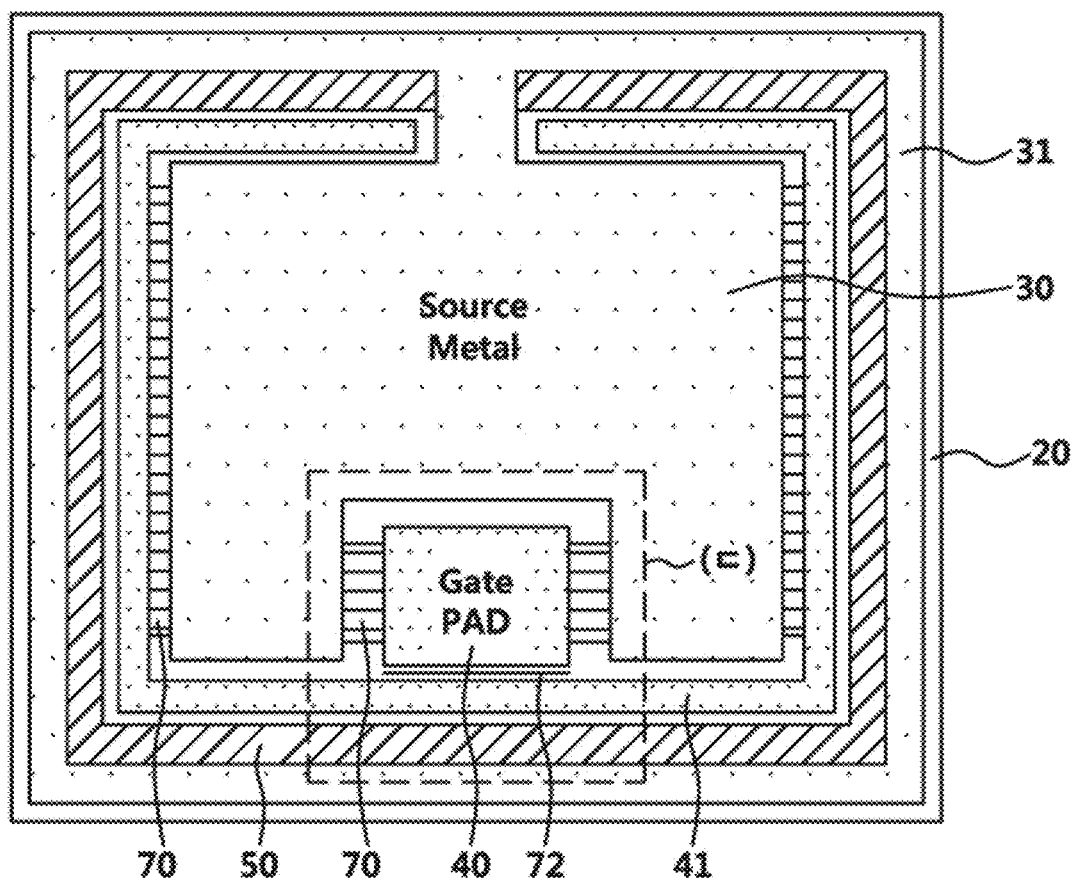
FIG. 4A illustrates another example of a low voltage MOSFET semiconductor device, constructed according to the principles of the disclosure.
Figure 4B:
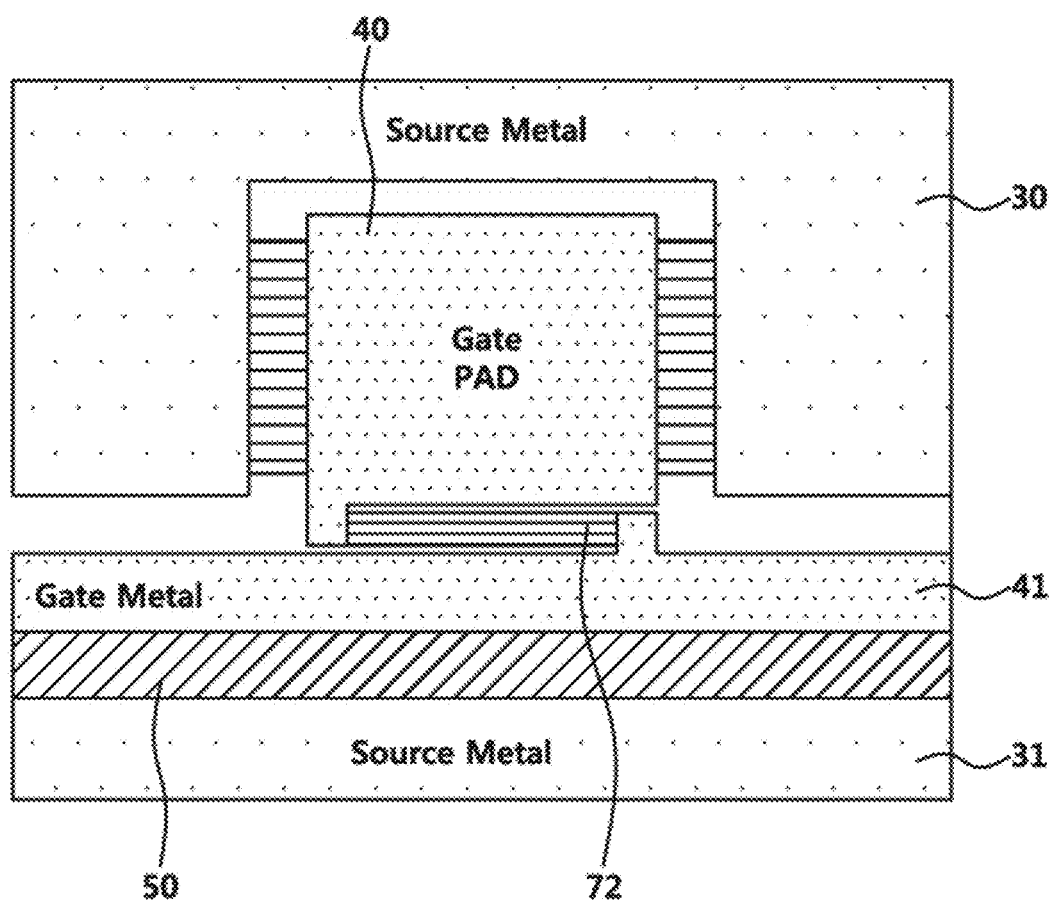
FIG. 4B illustrates a partial enlarged view of the semiconductor device shown in FIG. 4A.

FIGS. 4A and 4B illustrate another example of the semiconductor device 100, constructed according to the principles of the disclosure. As shown in FIG. 4A, the semiconductor device 100 may include, for example, a substrate 20, a source metal 30, an external source metal 31, a gate pad 40, a gate metal 41, a trench 70, a resistor 72, and/or the like. The source metal 30, the external source metal 31, the gate pad 40 and the gate metal 41 may be formed on or in the substrate 20. The gate pad 40 may be formed adjacent to the source metal 30. The gate metal 41 may be formed around the source metal 30. The resistor 72 may connect the gate pad 40 and the gate metal 41. The external source metal 31 may be formed surrounding the gate metal 41 and connected to a side of the source metal 30. The diode 50 may be formed along the gate metal 41 and between the gate metal 41 and the external source metal 31. The trench 70 may be formed extending between the gate metal 41 and the source metal 30 and between the gate pad 40 and the source metal 30.

Referring to FIG. 4B, the gate resistor 72 may be formed between and spaced apart from the gate pad 40 and the gate metal 41 with a predetermined gap therebetween. One end of the gate resistor 72 may be connected to the gate pad 40 and the other end may be connected to the gate metal 41. As seen in the cross section view of FIG. 2C, the gate resistor 72 may be formed of a resistive material (e.g., polysilicon or the like), which fills the trench 70 formed on the substrate 20 at a constant depth.

The resistance of the gate resistor 72 may be optimized by adjusting the physical configuration, e.g., area, length, etc., depending on usages. The gate resistor 72 may delay the in-flow ESD voltage and current into the gate metal 41 and the gate electrode 42 through the gate pad 40.

While the disclosure has been described in terms of exemplary embodiments, those skilled in the art will recognize that the disclosure can be practiced with modifications in the spirit and scope of the appended claim, drawings and attachment. The examples provided herein are merely illustrative and are not meant to be an exhaustive list of all possible designs, embodiments, applications or modifications of the disclosure.

The terms "including," "comprising" and variations thereof, as used in this disclosure, mean "including, but not limited to," unless expressly specified otherwise.

The terms "a," "an," and "the," as used in this disclosure, means "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, or the like, may be described in a sequential order, such processes and methods may be configured to work in alternate orders. In other words, any sequence or order of steps that may be described does not necessarily indicate a requirement that the steps be performed in that order. The steps of the processes or methods described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

What is claimed is:

1. A semiconductor device, comprising:
   a substrate;
   a source metal formed on the substrate;
   a gate pad formed on the substrate adjacent to the source metal;
   a gate metal formed on the substrate, coupled to the gate pad, and surrounding the source metal;
   a trench formed in the substrate and extending between a portion of the substrate underlying the source metal and a portion of the substrate underlying the gate pad;
   a gate electrode formed in the trench and coupled to the gate pad; and
   a diode formed between the gate metal and the source metal and completely surrounding a perimeter of the source metal.

2. The semiconductor device of claim 1, wherein the diode is formed between the source metal and the gate pad.

3. The semiconductor device of claim 1, wherein the diode comprises a first electrode connected to the source metal and a second electrode connected to the gate metal.

4. The semiconductor device of claim 3, wherein the diode further comprises:
   a pair of first regions doped with a first conductivity type impurity; and
   a second region doped with a second conductivity type impurity and sandwiched between the pair of first regions.

5. The semiconductor device of claim 1, further comprising a protection film formed on side and bottom surfaces of the substrate surrounding the trench, wherein the gate electrode is formed on the protection film in the trench.

6. The semiconductor device of claim 1, wherein the trench comprises at least one of:
   a first trench extending between the portion of the substrate underlying the source metal and the portion of the substrate underlying the gate pad; and a second trench extending between the portion of the substrate underlying the source metal and a portion of the substrate underlying the gate metal.

7. The semiconductor device of claim 1, wherein the trench further comprises:
a cell trench formed in the portion of the substrate underlying the source metal; and
an extended trench formed in the substrate and extending from the portion of the substrate underlying the source metal to the portion of the substrate underlying the gate pad or the gate metal, and
wherein the gate electrode further comprises:
a cell gate electrode formed in the cell trench; and
an extended gate electrode formed in the extended trench.

8. The semiconductor device of claim 1, further comprising a gate resistor connected between the gate pad and the gate metal.

9. The semiconductor device of claim 1, comprising a trench metal oxide silicon field effect transistor (MOSFET).

10. The semiconductor device of claim 1,
wherein the gate metal is connected to the gate pad by the gate electrode that delays at least one of a current or a voltage associated with an electrostatic discharge (ESD) from passing between the gate metal and the gate pad, and wherein the diode is connected between the source metal and the gate metal, the diode including a first region proximate to the source metal, a second region proximate the gate metal, and a third region disposed between the first region and the second region, wherein the first region and the second region are doped with a first conductivity type impurity, and the third region is doped with a second conductivity type impurity different than the first conductivity type impurity.

11. A semiconductor device, comprising:
a substrate;
a first source metal formed on the substrate;
a gate pad formed on the substrate adjacent to the first source metal with a first gap therebetween;
a gate metal formed on the substrate and at least partially surrounding the first source metal;
a second source metal formed on the substrate, connected to the first source metal and surrounding the gate metal with a second gap therebetween; and
a diode formed on the substrate in the second gap between the second source metal and the gate metal.

12. The semiconductor device of claim 11, wherein the gate metal is connected to the gate pad.

13. The semiconductor device of claim 11, further comprising a gate resistor coupled between the gate pad and the gate metal.

14. The semiconductor device of claim 11, wherein the diode comprises a first electrode connected to the second source metal and a second electrode connected to the gate metal.

15. The semiconductor device of claim 14, wherein the diode further comprises:
a pair of first regions doped with a first conductivity type impurity; and
a second region doped with a second conductivity type impurity and sandwiched between the pair of first regions.

16. The semiconductor device of claim 11, further comprising:
a trench formed in the substrate; and
a gate electrode formed in the trench.

17. The semiconductor device of claim 16, further comprising a protective film formed on side and bottom surfaces of the substrate surrounding the trench, wherein the gate electrode is formed on the protective film.

18. A semiconductor device, comprising:
a substrate;
a source metal and a gate pad formed on the substrate and spaced apart from each other;
a gate metal formed on the substrate and surrounding the source metal, wherein the gate metal is spaced apart from the source metal with a predetermined gap therebetween;
a trench formed in the substrate and extending between at least a portion of the substrate underlying the source metal and the gate pad;
a gate electrode formed in the trench and coupled to the gate pad; and
a diode formed in the predetermined gap between the source metal and the gate metal and completely surrounding a perimeter of the source metal.

* * * * *